United States Patent
Michael et al.

(10) Patent No.: US 6,707,715 B2
(45) Date of Patent: Mar. 16, 2004

(54) REFERENCE GENERATOR CIRCUIT AND METHOD FOR NONVOLATILE MEMORY DEVICES

(75) Inventors: Oron Michael, Netanya (IL); Ilan Sever, Kfar-Vitkin (IL)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/922,016

(22) Filed: Aug. 2, 2001

(65) Prior Publication Data

US 2003/0026133 A1 Feb. 6, 2003

(51) Int. Cl.[7] .............. G11C 16/04; G11C 7/00
(52) U.S. Cl. .............. 365/185.18; 365/189.05; 365/189.07; 365/189.09
(58) Field of Search .............. 365/185.18, 185.21, 365/185.2, 185.25, 189.09, 189.05

(56) References Cited

U.S. PATENT DOCUMENTS

| | | | | |
|---|---|---|---|---|
| 4,388,705 A | * | 6/1983 | Sheppard | 365/210 |
| 4,882,507 A | * | 11/1989 | Tatsumi et al. | 326/28 |
| 4,918,339 A | | 4/1990 | Shigeo et al. | 327/310 |
| 5,729,493 A | | 3/1998 | Morton | 365/185.21 |
| 5,818,260 A | * | 10/1998 | Kuo | 326/17 |
| 5,856,748 A | * | 1/1999 | Seo et al. | 327/53 |
| 5,936,888 A | * | 8/1999 | Sugawara | 365/185.2 |
| 5,986,954 A | | 11/1999 | Pascucci | 365/203 |
| 5,999,456 A | * | 12/1999 | Sali et al. | 365/185.25 |
| 6,226,213 B1 | * | 5/2001 | Chih | 365/210 |
| 6,310,810 B1 | * | 10/2001 | Jain | 365/205 |
| 6,310,812 B1 | * | 10/2001 | Pochmuller | 365/210 |
| 6,363,029 B1 | | 3/2002 | Watanabe et al. | 365/230.06 |
| 6,438,032 B1 | | 8/2002 | Pekny et al. | 365/185.18 |
| 6,490,200 B2 | | 12/2002 | Cernea et al. | 365/185.21 |

* cited by examiner

*Primary Examiner*—David Nelms
*Assistant Examiner*—Ly Duy Pham
(74) *Attorney, Agent, or Firm*—Lisa K. Jorgenson; Andre Szuwalski

(57) ABSTRACT

Reference generator circuitry for providing a reference to sense amplifiers in a flash memory device. The circuitry includes a reference current generator for generating a reference current for use by the sense amplifier circuits. A current buffer circuit in the flash memory device mirrors the reference current and applies a plurality of mirrored reference currents to the reference inputs of the sense amplifiers. A startup circuit is utilized in order to provide a fast settling time of the reference node appearing at the input of the sense amplifiers. The startup circuit includes first and second discharge current stages, with the first discharge current stage discharging the charge appearing at the reference node input of the sense amplifiers based upon a bandgap reference current. The second discharge current stage discharging the charge appearing at the reference node input of the sense amplifiers based upon the reference current. Each discharge current stage utilizes feedback to gradually decrease the rate of discharge by the discharge current stage so that the discharge current stages are disabled by the time the voltage appearing at the reference node input of the sense amplifiers reaches the desired voltage level.

42 Claims, 4 Drawing Sheets

REFERENCE GENERATOR CIRCUIT AND METHOD FOR NONVOLATILE MEMORY DEVICES

BACKGROUND OF THE INVENTION

1. Technical Field of the Invention

The present invention relates to a reference current generator for memory devices, and particularly to circuitry for more effectively generating a reference current in nonvolatile memory devices.

2. Description of the Related Art

The first nonvolatile memories were electrically programmable read-only memories (EPROMs). In these memories, the memory cells include a floating-gate transistor that is programmable using the hot carrier effect. Programming of an EPROM memory cell includes applying a potential difference between the drain and the source of the floating gate transistor in the presence of a high potential difference (of about 20 volts, this value varying according to the desired programming speed) between the control gate and the source. The application of the first of these potential differences generates an electrical field that gives rise to a flow of electrons in the channel. These electrons collide with atoms of the channel, causing the appearance of new free electrons. These electrons have very high energy (hence the term "hot carriers"). The high difference in potential between the control gate and the source of the floating gate transistor gives rise to a strong electrical field between the floating gate and the substrate, the effect of which is that certain of these electrons are injected into the floating gate, thus putting the memory cell in a state known as a "programmed" state.

The fact that the programming of a memory cell requires the application of voltages both to the control gate and to the drain of the floating-gate transistor eliminates the need for the use of a selection transistor to program one particular memory cell without programming the others. This results in a relatively small silicon area and the effectuation of large scale integration. By contrast, the erasure of all the memory cells of the memory is done substantially simultaneously by exposing the memory cells to ultraviolet radiation.

In addressing the need to individually erase EPROM memory cells, electrically erasable programmable read only memories (EEPROMs) were created. These memories are electrically programmable and erasable by tunnel effect (i.e., the Fowler Nordheim effect). The memory cells have a floating-gate transistor whose drain is connected to the bit line by a selection transistor. The gate of the selection transistor is connected to the word line. The gate of the floating-gate transistor is controlled by a bias transistor. Generally, the source of the floating gate transistor is connected to a reference potential, such as ground. These floating-gate transistors have an oxide layer between the substrate and the floating gate that is very thin to enable the transfer of charges by tunnel effect. The advantage of EEPROMs as compared with EPROMs lies in the fact that each memory cell is programmable and erasable independently of the other EEPROM cells. The tradeoff here is that a larger surface area of silicon is required and therefore a smaller scale of integration is achieved.

A third type of memory has more recently gained popularity. This type of memory, flash EPROMs, combines the relatively high integration of EPROMs with the ease of programming and erasure of EEPROMs. Flash memory cells can be individually programmed utilizing the hot carrier effect in the same way as EPROM cells are programmed. Flash memory cells are also electrically erasable by the tunnel effect. The memory cells of a flash EPROM memory includes a floating-gate transistor that has an oxide layer whose thickness is greater than the oxide layer thickness of an EEPROM floating gate transistor but smaller than the oxide layer thickness of an EPROM floating gate transistor. Consequently, the flash memory cell is capable of erasure by the tunnel effect. For erasure, a highly negative potential difference is created between the control gate and the source of the floating gate transistor, the drain being left in the high impedance state or connected to the ground potential so that a high electrical field is created which tends to remove the electrons from the floating gate.

Flash EPROM devices, hereinafter referred to as flash memory devices, typically include at least one array of flash memory cells organized into rows and columns of flash memory cells. The array is typically partitioned into blocks, each of which is further divided into sectors. A row decoder and column decoder are used to select a single row and at least one column of memory cells based upon the value of an externally generated address applied to the flash memory device. Sense amplifiers are coupled to the column lines corresponding to the columns of memory cells to amplify the voltage levels on the addressed column lines based upon the data values stored in the addressed flash memory cells. The particular implementations of the array and the row and column decoders are known in the art and will not be described further for reasons of simplicity.

A conventional sense amplifier circuit includes a differential amplifier circuit that generally senses a voltage differential between the voltage appearing on a column line connected to a reference cell and the voltage appearing on a reference node and the voltage appearing on a column line connected to an addressed memory cell, and drives a sense output signal (that is coupled to the data output pins of the flash memory device) based upon the sensed voltage differential.

Conventional flash memory devices include a reference current generator for generating a reference current for use by the sense amplifier circuits. A current mirror circuit in the flash memory device mirrors the reference current and applies a single mirrored reference current to all of the sense amplifiers. A startup circuit is utilized in some existing flash memory devices in order to provide a fast settling time of the reference node appearing at the input of the sense amplifiers. An existing startup circuit includes first and second discharge current stages, with each discharge current stage discharging the charge appearing at the reference node input of the sense amplifiers based upon a bandgap reference current. Each discharge current stage utilizes feedback to gradually decrease the rate of discharge by the discharge current stage so that the discharge current stages are disabled by the time the voltage appearing at the reference node input of the sense amplifiers reaches the desired voltage level.

The known reference current generator and startup circuits, however, have shortcomings. For instance, the use of the reference current generator and corresponding current mirror circuit limits the number of sense amplifiers that may be utilized at one time. There is a relatively slow settling time of the reference voltage due to the large capacitive loading on the reference current generator/mirror circuit when a large number of sense amplifiers are used. In addition, the limitation exists due to the amount of noise introduced within each sense amplifier that may affect data integrity. As a result, certain flash memory device features, such as burst mode and page mode features, cannot be effectively executed in conventional flash memory devices.

Based upon the foregoing, there is a need to more effectively and accurately provide reference current levels to sense amplifiers in a nonvolatile memory device, such as a flash memory device.

SUMMARY OF THE INVENTION

Embodiments of the present invention overcome shortcomings in prior flash memory devices and satisfy a significant need for a nonvolatile memory device, such as a flash memory device, that quickly and efficiently provides a reference current to sense amplifiers in the nonvolatile memory device.

In an exemplary embodiment of the present invention, the nonvolatile memory device includes a reference generator circuit for generating a reference current for application to the reference input of the sense amplifiers in the nonvolatile memory device. A bandgap reference circuit generates a bandgap voltage reference. At least one startup circuit initially sets the reference input of the sense amplifiers to a predetermined voltage level. The startup circuit allows for a relatively quick settling of the reference input to the desired predetermined voltage level.

The startup circuit includes a first circuit stage coupled to the bandgap reference circuit for receiving a bandgap current generated from the bandgap voltage reference. The first circuit stage discharges a charge appearing on the reference input of the sense amplifiers from an initial voltage level, such as the supply voltage Vdd, to a voltage level greater than the predetermined voltage level, a rate of discharge being based upon the received bandgap current. The startup circuit further includes a second circuit stage coupled to the reference generator circuit and including a second discharge circuit for discharging a charge appearing on the reference input of the sense amplifiers from the initial voltage level towards the predetermined voltage level, a rate of discharge being based upon the reference current. By basing the rate of discharge of the second discharge circuit upon the reference current, the startup circuit is better matched to the reference generator circuit across process and operational corners.

For flash memory devices having a relatively large number of sense amplifiers, a current buffer circuit may be disposed between the output of the reference generator circuit and the reference inputs of the sense amplifiers. In this case, the current buffer circuit may be implemented as current mirror circuitry having a first circuit leg and a plurality of second circuit legs. The reference current provided by the reference current generator passes through the first circuit leg. The reference current is thereby mirrored in each second circuit leg. Each second circuit leg provides the mirrored reference current to a distinct set of sense amplifiers. In this way, the reference current generated by the reference current generator has lower capacitive load so as to provide a faster settling time. The reference current generator is also isolated from coupling noise associated with the sense amplifiers, which may approach nontrivial levels for a nonvolatile memory device having many sense amplifiers.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

Figure 1:
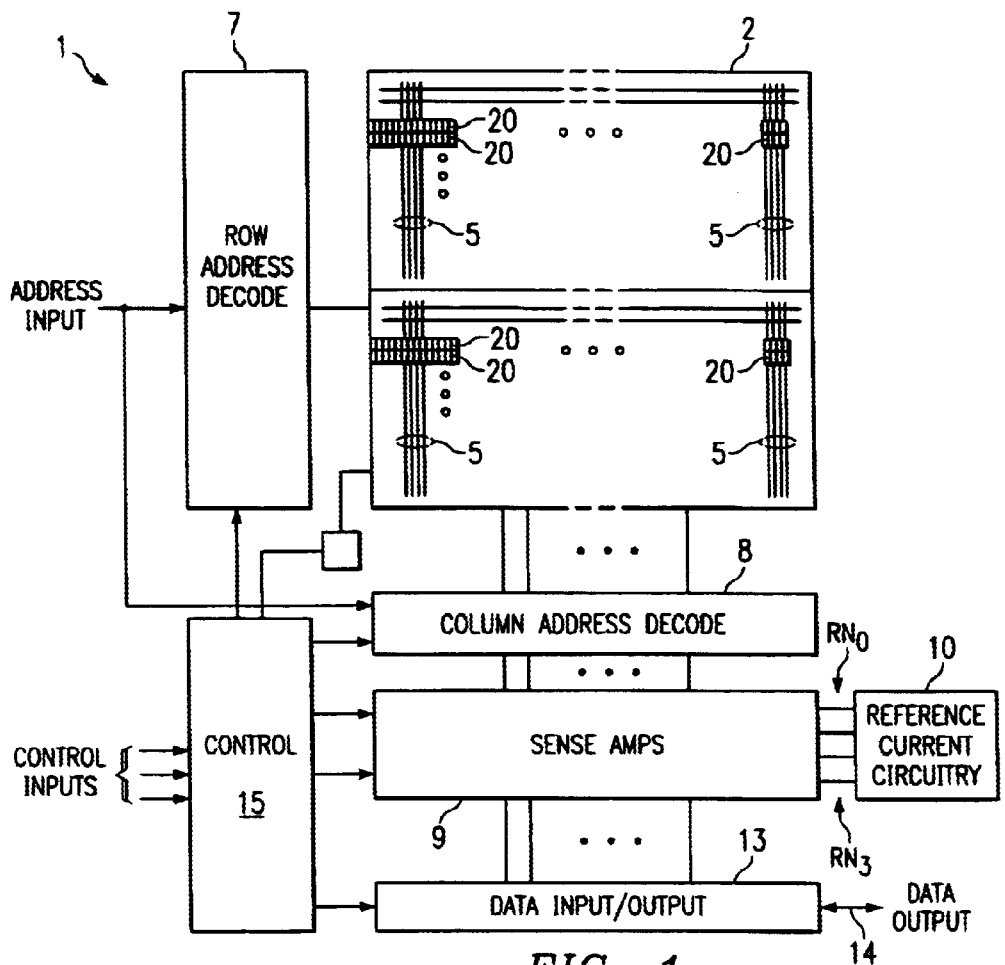
FIG. 1 is a block diagram of a nonvolatile memory device according to the exemplary embodiment of the present invention.

The present invention will now be described more fully hereinafter with reference to the accompanying drawings in which an exemplary embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Referring to FIGS. 1–4, there is disclosed a nonvolatile memory device 1 according to an exemplary embodiment of the present invention. It is understood that memory device 1 may be any type of nonvolatile memory device, such as a flash memory device. Memory device 1 will be described below as a flash memory device for reasons of simplicity.

Flash memory device 1 includes one or more arrays or banks 2 of memory cells 20. Each array 2 of memory cells 20 may be arranged into rows and columns of memory cells 20. Each array 2 may be partitioned into blocks of memory cells 20, with each block being further partitioned into one or more sectors of memory cells 20 (not shown). Although flash memory device 1 is illustrated in FIG. 1 as having only one array/bank 2 of memory cells 20, it is understood that flash memory device 1 may include two or more arrays 2 of memory cells 20.

Array 2 is shown in FIG. 1 as being relatively sparsely populated with memory cells 20 for reasons of clarity. It is understood that array 2 is substantially entirely populated with memory cells 20 arranged in rows and columns of memory cells 20 as described above. Although memory cells 20 are described herein as flash memory cells, it is understood that memory cells 20 may be other types of nonvolatile memory cells, such as EPROM memory cells.

The memory cells 20 in each column may be connected to a distinct column line 5, and the memory cells 20 in each row of memory cells 20 in a block may be connected to a distinct row line. Column lines 5 may be local column lines that are coupled to main column lines (not shown in FIG. 1) for providing the selected local column lines to the periphery of array 2. The use of local and main column lines in flash memories are known in the art and will not be described in greater detail for reasons of simplicity.

Flash memory device 1 may further include row decode circuitry 7 which receives an externally generated input address or portion thereof and selects and/or activates a row of memory cells 20 based upon the input address. In particular, the memory cells 20 are selected by connecting the memory cells 20 in the addressed row to the column lines 5. Row decode circuitry 7 may include logic that, for example, in response to receiving an externally generated address, drives a single row line corresponding to the externally generating address to a first voltage level to activate each memory cell 20 in the row, while driving the remaining row lines to another voltage level to deactivate the memory cells 20 in the remaining rows. Row decode circuitry 7 may be implemented with boolean logic gates as is known in the art.

Further, flash memory device 1 may include column decode circuitry 8 which receives an externally generated input address or portion thereof and selects one or more column lines corresponding to the externally generated address. Column decode circuitry 8 may, for example, be implemented as multiplexing circuitry connected to each column line 5 in array 2 of memory cells 20. Column decode circuitry 8 is connected to each column line 5 of memory cells 20.

Flash memory device 1 may include sense amplifiers 9 that sense the voltage levels appearing on the selected column lines 5 corresponding to the data stored in the addressed memory cells 20, and drive sense amplifier output signals to voltage levels that are more easily interpreted or otherwise handled by circuitry external to array 2.

Flash memory device 1 may include a precharge circuit (not shown) that precharges column lines 5 to a certain voltage level during the initial portion of a memory access operation.

Flash memory device 1 may include a data input/output (I/O) circuit 13 that generally couples addressed memory cells 20 to external I/O data pins 14 of flash memory device 1. As shown in FIG. 1, data I/O circuit 13 is connected to the output of sense amplifiers 9. Flash memory device 1 may also include control circuitry 15 for receiving externally generated, input control signals and controlling the various components of flash memory device 1 to perform memory access operations. For instance, control circuit 15 may generate timing/control signals for controlling row decode circuitry 7, column decode circuitry 8, data I/O circuit 13 and sense amplifiers 9 during a memory access operation.

Figure 2:
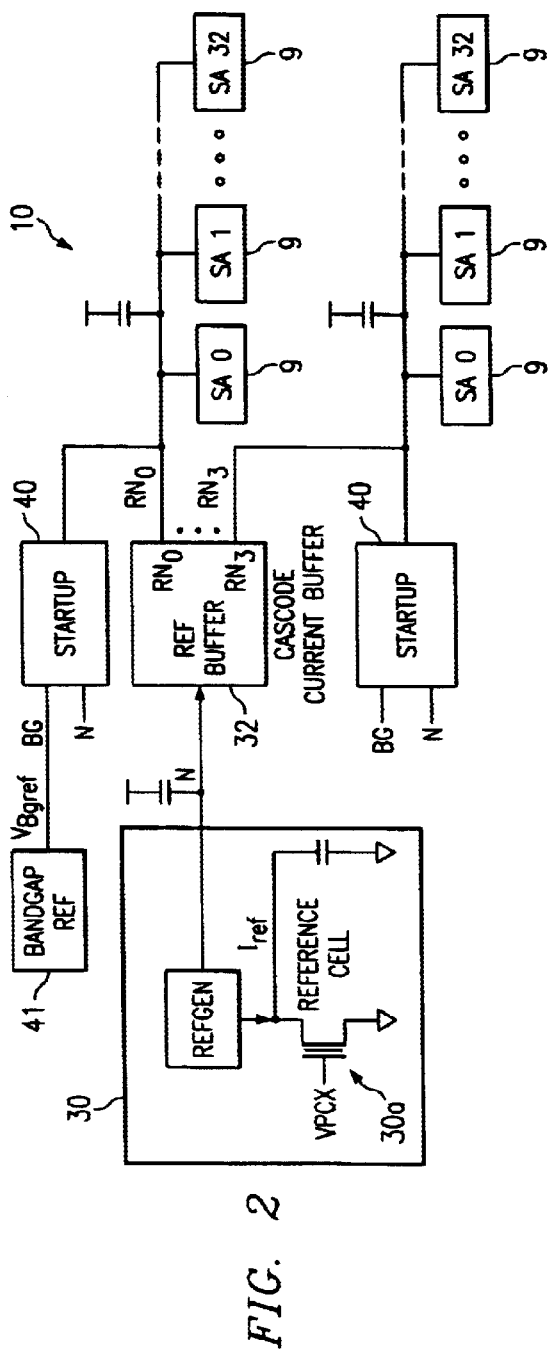
FIG. 2 is a diagram of reference current circuitry of the nonvolatile memory device of FIG. 1.
Figure 4:
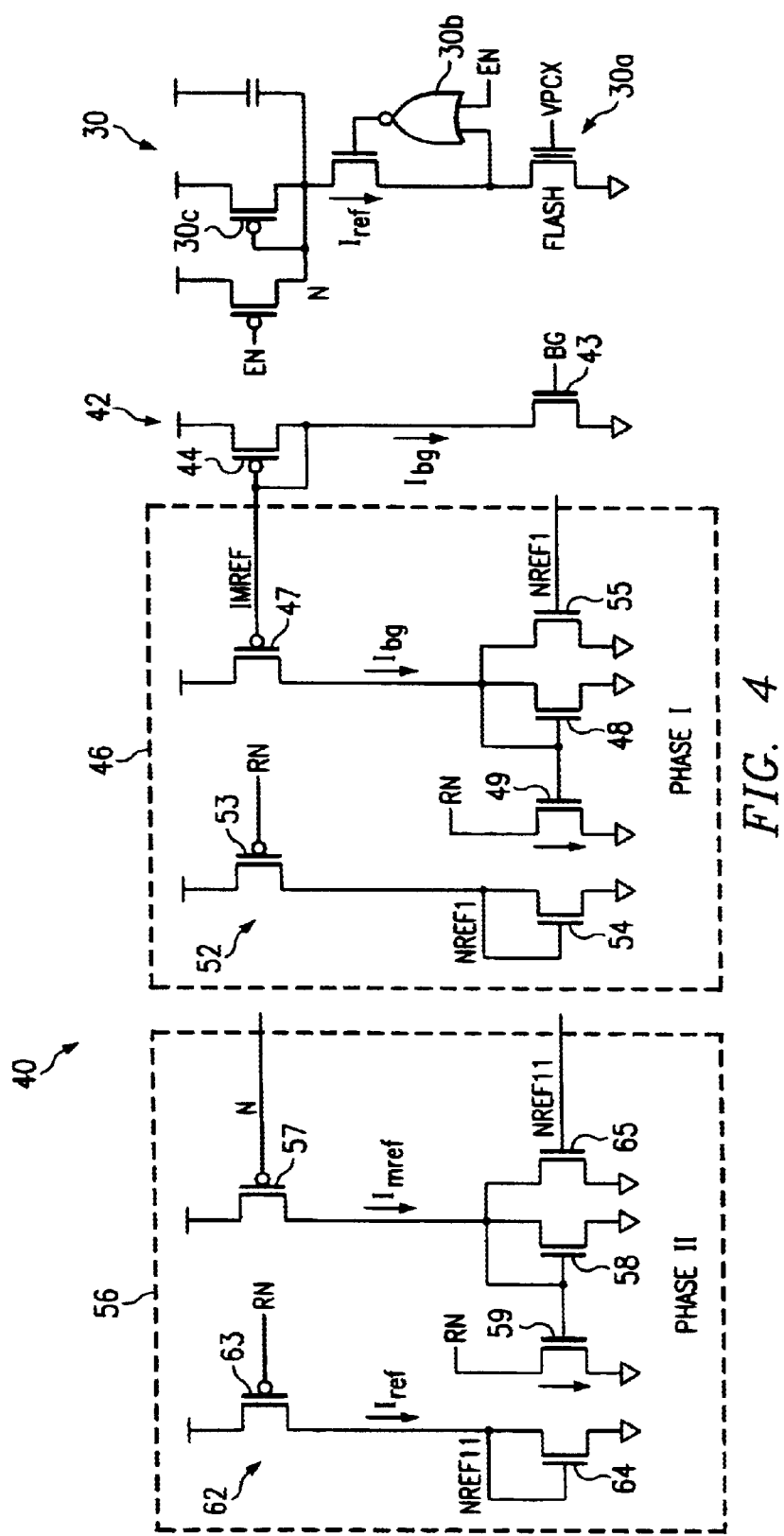
FIG. 4 is a diagram of startup circuit of the reference current circuitry of FIG. 2.

Each memory cell 20 of flash memory device 1 is adapted to provide one of at least two distinct current levels that correspond to the data value stored in the memory cell 20. In order to be able to read the data value stored in a memory cell 20, memory device 1 may further include reference current circuitry 10. Reference circuitry 10 is adapted to provide a reference current to sense amplifiers 9 along a plurality of reference lines $RN_O$–$RN_3$. Referring to FIG. 2, reference circuitry 10 may include a reference generator circuit 30 which provides a predetermined current level that is between the two current levels capable of being provided by memory cell 20. Reference generator circuit 30 generates reference current Iref on a reference node N, as shown in FIG. 2. Reference generator circuit 30 includes a flash memory transistor and/or cell 30a, enable circuitry 30b and a pullup device 30c (FIG. 4). When enabled by enable circuitry 30b, the reference current Iref passes through flash memory transistor 30a. Because reference generators are known in the art, reference generator 30 will not be described in detail for reasons of simplicity.

In conventional flash memory devices, a single current mirror duplicates the reference current and applies a single duplicated reference current to all of the sense amplifiers. In part because the number of sense amplifiers 9 appearing in flash memory device may be substantially greater than the number of sense amplifiers in conventional flash memory devices, flash memory device 1 includes current buffer circuitry 32 having an input connected to reference node N and a plurality of output signals RN. Each output signal RN of current buffer circuitry 32 is connected to a distinct group or set of sense amplifiers 9. By dividing sense amplifiers 9 into a plurality of groups, the capacitive loading on each output of current buffer circuitry 32 is lowered which thereby improves the settling time of reference generator circuit 30.

Although FIG. 2 shows sense amplifiers 9 being divided into four groups, it is understood that sense amplifiers 9 may be divided into any number of groups, with each group being driven by a separate circuit.

Figure 3:
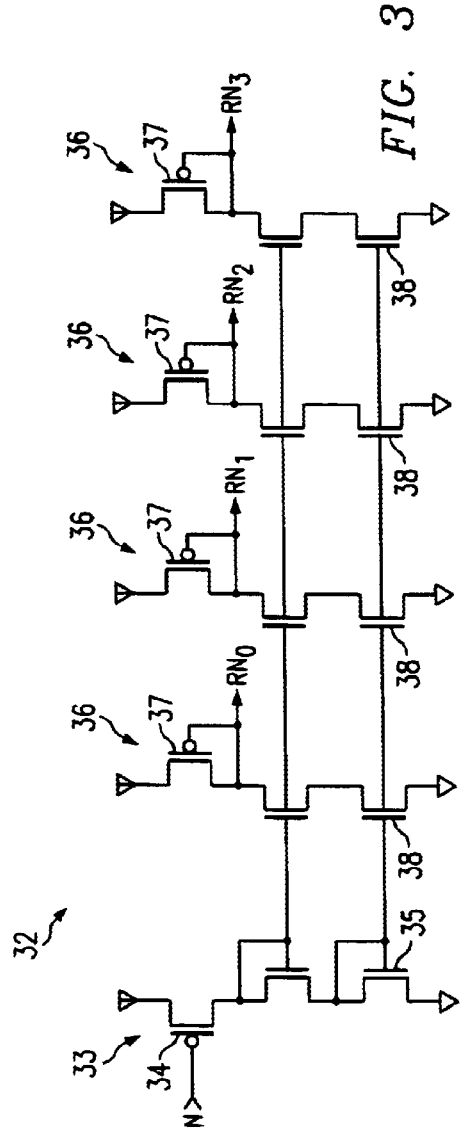
FIG. 3 is a diagram of a cascode current buffer circuit of the reference current circuitry of FIG. 2.

An implementation of current buffer 32 is shown in FIG. 3. As can be seen in FIG. 3, current buffer circuitry 32 is implemented as a current mirror having a first circuit leg 33 which is connected to reference node N and passes a first current through first circuit leg 33 based upon the voltage appearing on reference node N. First circuit leg 33 may include a first transistor 34 having a control terminal connected to reference node N and a source terminal coupled to supply voltage Vdd. First transistor 34 passes a current that is based upon the voltage appearing on reference node N. A second transistor 35 is coupled to first transistor 34 so as to receive the current passing through first transistor 34.

Current buffer circuitry 32 further includes a plurality of second circuit legs 36, each of which includes a first transistor 37 having a source terminal coupled to supply voltage Vdd, a drain terminal and a control terminal coupled together. Each second circuit leg 36 further includes a second transistor 38 having a drain terminal coupled to the drain terminal of first transistor 37, a source terminal connected to the ground reference and a control terminal connected to the control terminal of second transistor 35 of first circuit leg 33. As can be seen, the current passing through second transistor 35 of first circuit leg 33 is mirrored in second transistor 38 of each second circuit leg 36. The output of each second circuit leg 36 may be taken at the drain terminal of first transistor 37. The output of each second circuit leg is connected to the reference input of a distinct group of sense amplifiers 9, as discussed above and shown in FIG. 2.

Current buffer circuit 32 advantageously reduces the capacitive loading at the output of reference current generator 30, which thereby reduces settling time. In addition, current buffer circuit 32 isolates reference current generator 30 from coupling noise generated by sense amplifiers 9.

Although the transistors of first circuit leg 33 and second circuit legs 36 are illustrated in FIG. 3 as n-channel MOS transistors, it is understood that the transistors may be other types of transistors, such as p-channel MOS transistors. In addition, although current buffer circuitry 32 is shown in FIG. 3 as including four second circuit legs 36, it is understood that current buffer circuitry 32 may include any number of second circuit legs 36.

In order to ensure that the current passing through second transistor 35 of first circuit leg 33 is accurately mirrored in second transistor 38 of each second circuit leg 36, the layout of second transistor 38 of each second circuit leg 36 substantially matches the layout of second transistor 35 of first circuit leg 33.

The reference input of sense amplifiers 9 are initially set to the power supply voltage Vdd. Flash memory device 1 further includes one or more startup circuits 40 for relatively quickly bringing the voltage appearing at the reference input of sense amplifiers 9 to a desired voltage level. In this way, a memory read operation may be performed sooner than in prior flash memory devices. In the exemplary embodiment of the present invention, flash memory device 1 includes a startup circuit 40 for each group of sense amplifiers 9. FIG. 4 illustrates an implementation of a startup circuit 40 and reference generator circuit 30.

Startup circuit 40 may include a bandgap reference circuit 41 that generates a bandgap reference voltage Vbgref. In addition, startup circuit 40 may include reference duplicating circuit 42 which generates a current that, to some extent, duplicates the reference current Iref generated by reference generator circuit 30. Reference duplicating circuit 42 includes a first transistor 43 having a source terminal coupled to the ground reference and a gate terminal connected to bandgap reference voltage Vbgref so that a bandgap current Ibg passes through first transistor 43 that somewhat resembles the reference current Iref. Reference duplicating circuit 42 further includes a second transistor 44 connected between first transistor 43 and supply voltage Vdd and sources bandgap current Ibg to first transistor 43.

Startup circuits 40 are adapted to initially discharge the voltage appearing at the reference input of sense amplifiers 9. Each startup circuit 40 includes a first discharge circuit or stage 46 that discharges the voltage appearing on the reference input of sense amplifiers 9 associated with the startup circuit 40 (hereinafter referred to as the "reference input node RN"). First discharge circuit 46 discharges the voltage appearing on the reference input node RN associated therewith until the voltage reaches an intermediate voltage level greater than the desired predetermined voltage level. First discharge circuit 46 includes a first transistor 47 having a source terminal connected to the supply voltage Vdd and a control terminal connected to the control terminal of second transistor 44 of reference duplicating circuit 42. In this way, the current passing through second transistor 44, bandgap current Ibg, is mirrored in first transistor 47. First discharge circuit 46 further includes a second terminal 48 having a drain terminal coupled to the drain terminal of first transistor 47 and a control terminal connected to the drain terminal of first transistor 48. A third transistor 49 has a drain terminal connected to the corresponding reference input node RN and a control terminal connected to the control terminal of second transistor 48 so as to form a current mirror therewith. Third transistor 49 is sized larger than the size of second transistor 48 according to a desired discharge speed and settling time. In this way, the reference input node RN is discharged by a current passing through third transistor 49 that is based upon the bandgap current Ibg.

First discharge circuit 46 further includes control circuitry 52 for gradually decreasing the amount of the bandgap current Ibg sunk by second transistor 48 so that current sunk by third transistor 49 is stopped when the voltage appearing on the reference input voltage reaches the intermediate voltage level. The control circuitry 52 relies upon feedback to gradually decrease the bandgap current sunk by second transistor 48. Control circuitry 52 includes a fourth transistor 53 having a source terminal connected to supply voltage Vdd and a control terminal connected to the reference input node RN. A fifth transistor 54 of control circuitry 52 includes a drain terminal and a control terminal coupled to the drain terminal of fourth transistor 53 and a source terminal connected to the ground reference. As can be seen, the current passing through fourth transistor 53 and fifth transistor 54 is based upon the voltage level appearing on the corresponding reference input node RN. With the corresponding reference input node RN initially charged to the supply voltage Vdd, the current passing through fourth transistor 53 and fifth transistor 54 is relatively small. The current passing through fourth transistor 53 and fifth transistor 54 gradually increases as the voltage appearing on the corresponding reference input node RN gradually decreases. The voltage appearing at the drain terminals of fourth transistor 53 and fifth transistor 54 is at a low voltage level when the current passing through fourth transistor 53 and fifth transistor 54 is relatively small, and gradually increases as the current passing through fourth transistor 53 and fifth transistor 54 gradually increases.

Control circuitry 52 further includes a sixth transistor 55 having a drain terminal connected to the drain terminal of second transistor 48, a source terminal connected to the ground reference and a control terminal connected to the drain terminal of fourth transistor 53 and fifth transistor 54. Sixth transistor 55 gradually sinks an increasing amount of the bandgap current Ibg until substantially the entire amount of the bandgap current Ibg is sunk through sixth transistor 55, which effectively stops discharging of the corresponding reference input node RN by third transistor 49. The point at which the third transistor 49 no longer discharges the corresponding reference input node RN is when the reference input node RN reaches the intermediate voltage level, which is a voltage level between the supply voltage Vdd and the desired predetermined voltage. For example, third transistor 49 no longer sinks current from the corresponding reference input node RN when the voltage drop appearing on the reference input node RN reaches 75% of the total amount of the desired voltage drop (from the supply voltage Vdd to the desired predetermined voltage level).

Each startup circuit 40 includes a second discharge circuit or stage 56 that discharges the voltage appearing on the reference input node RN of sense amplifiers 9 associated with the startup circuit 40. Second discharge circuit 56 discharges the voltage appearing on the reference input node RN associated therewith until the voltage reaches the desired predetermined voltage level. Second discharge circuit 56 includes a first transistor 57 having a source transistor connected to the supply voltage Vdd and a control terminal connected to the output of reference generating circuit 30. In this way, the reference current Iref is mirrored in first transistor 57. Second discharge circuit 56 further includes a second transistor 58 having a drain terminal coupled to the drain terminal of first transistor 57 and a control terminal connected to the drain terminal of second transistor 58. A third transistor 59 has a drain terminal connected to the corresponding reference input node RN and a control terminal connected to the control terminal of second transistor 58 so as to form a current mirror therewith. Third transistor 59 is sized according to the desired discharge speed and settling time. In this way, the corresponding reference input node RN is discharged by a current passing through third transistor 59 that is based upon the reference current Iref.

Second discharge circuit 56 further includes control circuitry 62 for gradually decreasing the amount of the mirrored reference current Imref sunk by second transistor 58 so that voltage discharged by third transistor 59 is stopped when the voltage appearing on the reference input node RN reaches the desired predetermined voltage level. The control circuitry 62 relies upon feedback to gradually decrease the mirrored reference current Imref sunk by second transistor 58. Control circuitry 62 includes a fourth transistor 63 having a source terminal connected to supply voltage Vdd and a control terminal connected to the reference input node RN. A fifth transistor 64 of control circuitry 62 includes a drain terminal and a control terminal coupled to the drain terminal of fourth transistor 63 and a source terminal connected to the ground reference. As can be seen, the current passing through fourth transistor 63 and fifth transistor 64 is based upon the voltage level appearing on the corresponding reference input node RN. With the corresponding reference input node RN initially charged to the supply voltage Vdd, the current passing through fourth transistor 63 and fifth transistor 64 is relatively small. The current passing through fourth transistor 63 and fifth transistor 64 gradually increases as the voltage appearing on the corresponding reference input node RN gradually decreases. The voltage appearing at the drain terminals of fourth transistor 63 and fifth transistor 64 is at a low voltage level when the current passing through fourth transistor 63 and fifth transistor 64 is relatively small, and gradually increases as the current passing through fourth transistor 63 and fifth transistor 64 gradually increases.

Control circuitry 62 further includes a sixth transistor 65 having a drain terminal connected to the drain terminal of second transistor 58, a source terminal connected to the ground reference and a control terminal connected to the drain terminal of fourth transistor 63 and fifth transistor 65. Sixth transistor 65 gradually sinks an increasing amount of the mirrored reference current Imref until substantially the entire amount of the current is sunk through sixth transistor 65.

Second transistor 58 and fifth transistor 64 may have the same transistor structure as the transistors in the second circuit legs 36 of current buffer circuitry 32 so that the reference current Iref mirrored in the second circuit legs 36 substantially matches the reference current mirrored in second transistor 58 and fifth transistor 64.

Although FIG. 4 shows the transistors in reference generator circuit 30, reference duplicating circuit 42, first discharge circuit 46 and second discharge circuit 56 as being n-channel and p-channel MOS transistors, it is understood that the transistors could be other types of transistors as well.

Figure 6:
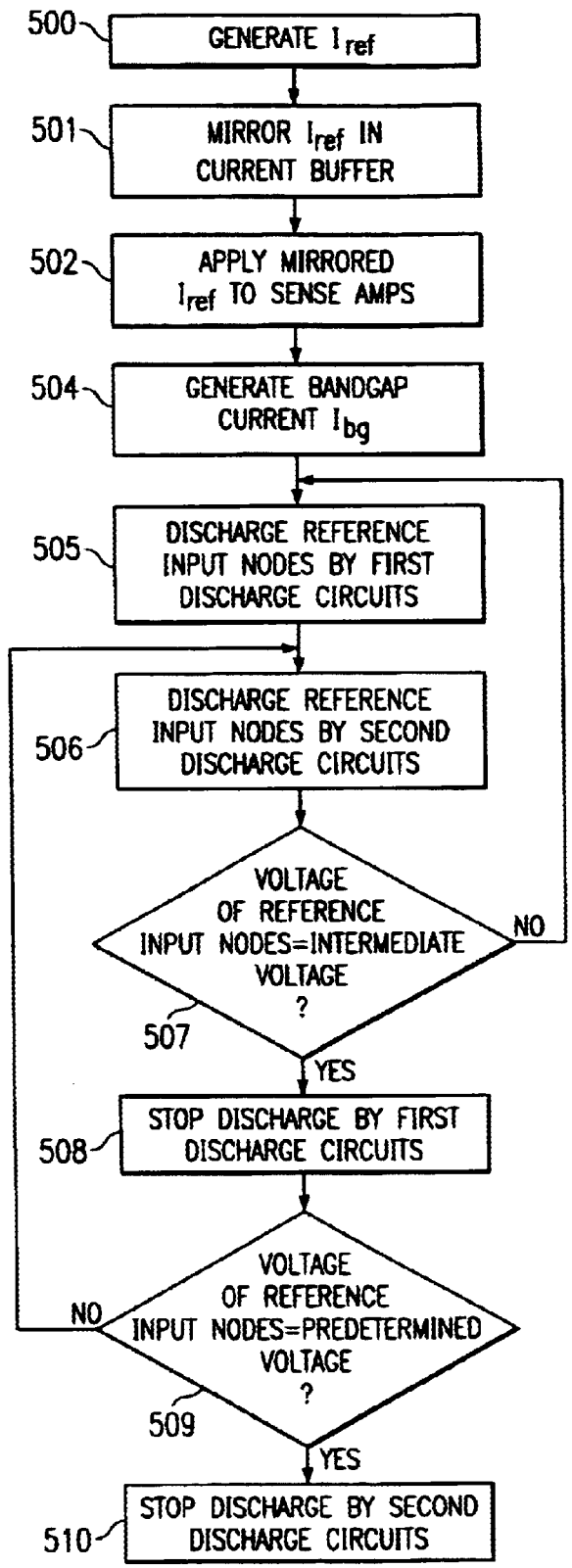
FIG. 6 is a flow chart illustrating an operation of the nonvolatile memory device of FIG. 1.

An operation of the flash memory device 1 will be described with reference to FIG. 6. Prior to performing a memory access operation and following flash memory device 1 powering up, the reference input nodes RN are charged to the power supply voltage Vdd. Reference current generator circuit 30 generates at 500 a reference current Iref to be applied to the reference input node RN of sense amplifiers 9. The first circuit leg 33 of current buffer circuitry 32 generates a duplicate of reference current Iref, which is mirrored in each second circuit leg 36 at 501. Each second circuit leg 36 applies at 502 its mirrored version of reference current Iref to the reference input of the group of sense amplifiers 9 corresponding to the second circuit leg 36.

At around the same time reference current Iref is generated, reference duplicating circuit 47 of each startup circuit 40 generates at 504 bandgap reference current Ibg. First discharge circuit 46 of each startup circuit 40 begins at 505 to discharge current from the reference input nodes RN, due to second transistor 48 sinking substantially all of the bandgap reference current Ibg. As the voltage appearing on the reference input nodes RN decreases, the amount of the bandgap reference current Ibg passing through sixth transistor 55 gradually increases. When the voltage level appearing on the reference input nodes RN reach the intermediate voltage level, substantially the entire bandgap reference current Ibg is sunk by sixth transistor 55 of the first discharge circuits 46, thereby stopping at 507 first discharge circuits 46 from discharging the reference input nodes RN.

During this time, second discharge circuit 56 of each startup circuit 40 discharges current from the reference input nodes RN. Initially, substantially the entire amount of the mirrored reference current Imref is sunk by second transistor 58, which causes third transistor 59 to discharge current from the corresponding reference input node RN. As the voltage appearing on a reference input node RN gradually decreases at 508 due to the discharging, the voltage appearing on the drain terminal of fourth transistor 63 and fifth transistor 64 gradually increases, which causes the current passing through second transistor 58 (and hence third transistor 59) to gradually decrease. When the voltage level appearing on the reference input nodes RN reach the desired predetermined voltage level, substantially the entire mirrored reference current Imref is sunk by sixth transistor 65 of the second discharge circuits 56, thereby stopping at 509 second discharge circuits 56 from discharging the reference input nodes RN.

Figure 5:
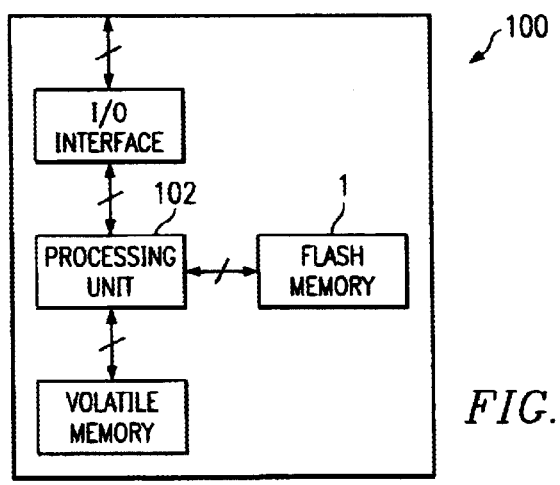
FIG. 5 is a block diagram of an electronics system/device in which the nonvolatile memory device of FIG. 1 is disposed.

It is understood that flash memory device 1 may be utilized in any of a number of devices requiring nonvolatile memory. For instance, flash memory device 1 may be located in an electronics system 100 (FIG. 5) having a processing unit 102 that accesses data stored in flash memory device 1. System 100 may be, for example, a computer and/or data processing device, or a telecommunications device, such as a wireless telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit for providing a reference current in a memory device, comprising:

a reference generator circuit for generating a reference current, the reference generator circuit comprising a reference memory cell having a structure similar to a structure of memory cells in the memory device, the reference current comprises the current flowing through the reference memory cell; and at least one startup circuit for initially setting the reference node to a predetermined voltage level, the reference node being coupled to the at least one sense amplifier, comprising:

a discharge circuit coupled to the reference generator circuit for discharging a charge appearing on the reference node from an initial voltage level towards the predetermined voltage level, a rate of discharge being based upon the reference current.

2. The circuit of claim 1, wherein the discharge circuit comprises:

a first transistor having a control terminal coupled to an output of the reference generator circuit, a first conduction terminal coupled to a supply voltage reference and a second conduction terminal;

a current mirror having a first leg coupled to the second conduction terminal of the first transistor and a second leg coupled to the reference node;

a second transistor having a first conduction terminal coupled to the second conduction terminal of the first transistor, a second conduction terminal coupled to a ground reference and a control terminal; and a drive circuit for driving the control terminal of the second transistor so that an amount of current from the first transistor passing through the second transistor is gradually increased.

3. The circuit of claim 2, wherein the drive circuit comprises:

a third transistor having a control terminal coupled to the reference node, a first conduction terminal coupled to a supply voltage reference and a second conduction terminal, the second conduction terminal being connected to the control terminal of the second transistor; and a fourth transistor having a first conduction terminal coupled to the second conduction terminal of the third transistor and the control terminal of the second transistor, a second conduction terminal coupled to the ground reference and a control terminal coupled to the first conduction terminal of the fourth transistor.

4. The circuit of claim 2, wherein the current mirror comprises:

a third transistor coupled between the second conduction terminal of the first transistor and the ground reference; and a fourth transistor coupled between the reference node and the ground reference, a control terminal of the fourth transistor being connected to the control terminal of the third transistor.

5. The circuit of claim 2, wherein:

the drive circuit has an input connected to the reference node and provides an output signal having a voltage that varies inversely with the voltage appearing on the reference node.

6. The circuit of claim 1, further comprising:

a current buffer circuit disposed between the reference generator circuit and the reference node, the current buffer circuit provides a substantial duplicate of the reference current to a plurality of reference nodes.

7. The circuit of claim 1, further comprising:

a current buffer circuit disposed between the reference generator circuit and the reference node, the current buffer circuit comprising at least one current mirror having a first leg coupled to the reference generator circuit and a second leg coupled to the reference node.

8. A method setting a reference node in a memory device having memory cells to a first predetermined voltage level, comprising:

generating a reference current, the reference current comprising current of a reference memory cell in the memory device;

applying a current proportional to the reference current to a reference node; and discharging a charge appearing on the reference node to a predetermined voltage level at a rate that is based upon the reference current.

second discharging the charge appearing on the reference node to a third predetermined level at a rate that is based upon the reference current.

9. The method of claim 8, wherein:

the step of applying comprises producing a plurality of currents proportional to the reference current and applying each current proportional to the reference current to a distinct reference node.

10. A nonvolatile memory device, comprising:

an array of memory cells arranged into rows and columns of memory cells and including a plurality of column lines, each column of memory cells being coupled to a distinct column line;

an address decode circuitry having input signals coupled to address input pins of the memory device and adapted to select a row and a plurality of columns of memory cells;

a plurality of sense amplifier circuits, each sense amplifier circuit being coupled to a plurality of column lines, column lines selected by the address decode circuitry being connected to the sense amplifier circuits, the sense amplifiers serving to detect a difference between the selected columns lines and a reference; and circuitry for providing a reference current to the sense amplifier circuits, comprising:

a reference generator circuit for generating a reference current, comprising a reference memory cell having a structure similar to the structure of the memory cells in the array of memory cells, the reference current comprising current flowing in the reference memory cell;

a current buffer circuit for generating at least one current proportional to the reference current and applying the at least one proportional current to at least one reference node to which at least some of the sense amplifier circuits are coupled; and at least one startup circuit for initially setting the at least one reference node to a predetermined voltage level, comprising a discharge circuit coupled to the reference generator circuit for discharging a charge appearing on the at least one reference node from an initial voltage level to the predetermined voltage level, a rate of discharge being based upon the reference current.

11. The memory device of claim 10, wherein the discharge circuit comprises:

a first transistor having a control terminal coupled to an output of the reference generator circuit, a first conduction terminal coupled to a supply voltage reference and a second conduction terminal;

a current mirror having a first leg coupled to the second conduction terminal of the first transistor and a second leg coupled to the reference node;

a second transistor having a first conduction terminal coupled to the second conduction terminal of the first transistor, a second conduction terminal coupled to a ground reference and a control terminal; and a drive circuit for driving the control terminal of the second transistor so that an amount of current from the first transistor passing through the second transistor is gradually increased.

12. The memory device of claim 11, wherein the drive circuit comprises:

a third transistor having a control terminal coupled to the reference node, a first conduction terminal coupled to a supply voltage reference and a second conduction terminal, the second conduction terminal being connected to the control terminal of the second transistor; and a fourth transistor having a first conduction terminal coupled to the second conduction terminal of the third transistor and the control terminal of the second transistor, a second conduction terminal coupled to the ground reference and a control terminal coupled to the first conduction terminal of the fourth transistor.

13. The memory device of claim 11, wherein the current mirror comprises:

a third transistor coupled between the second conduction terminal of the first transistor and the ground reference; and a fourth transistor coupled between the reference node and the ground reference, a control terminal of the fourth transistor being connected to a control terminal of the third transistor.

14. The memory device of claim 10, wherein the circuitry for providing further comprises a plurality of startup circuits, each startup circuit initially setting a distinct reference node to the predetermined voltage level.

15. The memory device of claim 14, wherein:
the current buffer circuit is disposed between the reference generator circuit and each reference node, the current buffer circuit providing to each reference node a current proportional to the reference current.

16. The memory device of claim 10, wherein:
the current buffer circuit comprises at least one current mirror having a first leg coupled to the reference generator circuit and a second leg coupled to the reference node.

17. A nonvolatile memory device, comprising:
an array of memory cells arranged into rows and columns of memory cells and including a plurality of column lines, each column of memory cells being coupled to a distinct column line;
address decode circuitry having input signals coupled to address input pins of the memory device and adapted to select a row and a plurality of columns of memory cells;
a plurality of sense amplifier circuits, each sense amplifier circuit being coupled to a plurality of column lines, column lines selected by the address decode circuitry being connected to the sense amplifier circuits, the sense amplifier circuits serving to detect a difference between the selected columns lines and a reference, the sense amplifier circuits being divided into a plurality of groups with each group of sense amplifier circuits being connected to a distinct first reference node; and
circuitry for providing a reference current to the sense amplifier circuits, comprising:
a reference generator circuit for generating a reference current level relative to a second reference node; and
current buffer circuitry having an input connected to the second reference node and having a plurality of outputs, each output providing to a distinct first reference node a current proportional to the reference current level.

18. The nonvolatile memory device of claim 17, wherein:
the current buffers comprise current mirror circuitry having a first leg connected to the second reference node and a plurality of second legs, the current in each second leg being based upon the current in the first leg, each second leg being connected to a distinct first reference node.

19. The nonvolatile memory device of claim 18, wherein:
the first leg of the current mirror circuitry includes a first transistor; and
each second leg of the current mirror circuitry includes a second transistor, the first transistor and the second transistors are substantially matched to each other.

20. The nonvolatile memory device of claim 18, wherein:
the first leg of the current mirror circuitry includes a first transistor; and
each second leg of the current mirror circuitry includes a second transistor, the first transistor and the second transistors are substantially the same size and have the same layout configuration.

21. The nonvolatile memory device of claim 17, wherein the circuitry for providing a reference current to the sense amplifier circuits further comprises:
at least one reference memory cell, the reference current comprising the current in the at least one reference memory cell;

a plurality of startup circuits for initially setting each first reference node to a predetermined voltage level, each startup circuit being associated with a distinct first reference node, each startup circuit comprising a discharge circuit coupled to the reference generator circuit for discharging a charge appearing on the first reference node associated therewith from an initial voltage level to the predetermined voltage level, a rate of discharge being based upon the reference current.

22. The nonvolatile memory device of claim 17, wherein the nonvolatile memory device comprises a flash memory device.

23. An electronics device, comprising:
a processing element; and
a nonvolatile memory device, comprising:
an array of memory cells arranged into rows and columns of memory cells and including a plurality of column lines, each column of memory cells being coupled to a distinct column line;
address decode circuitry having input signals coupled to address input pins of the memory device and adapted to select a row and a plurality of columns of memory cells;
a plurality of sense amplifier circuits, each sense amplifier circuit being coupled to a plurality of column lines, column lines selected by the address decode circuitry being connected to the sense amplifier circuits, the sense amplifier circuits serving to detect a difference between the selected columns lines and a reference, the sense amplifier circuits being divided into a plurality of groups with each group of sense amplifier circuits being connected to a distinct first reference node; and
circuitry for providing a reference current to the sense amplifier circuits, comprising:
a reference generator circuit for generating a reference current level relative to a second reference node; and
a current buffer circuitry having an input connected to the second reference node and having a plurality of outputs, each output providing to a distinct first reference node a current proportional to the reference current level.

24. The electronics device of claim 23, wherein:
the reference generator circuit comprises a reference cell transistor having a structure similar to the structure of a transistor in the memory cells in the array, the reference current comprising current flowing through the reference cell transistor; and
the circuitry for providing a reference current further comprises:
a plurality of startup circuits, each startup circuit being connected to a distinct first reference node and adapted to discharge a voltage appearing thereon at a rate based upon the reference current.

25. The circuit of claim 1, further comprising a current buffer circuit disposed between the reference generator circuit and the reference node, the current buffer circuit providing to the reference node a current proportional to the reference current.

26. The circuit of claim 25, wherein the current buffer circuit provides to the reference node a substantial duplicate of the reference current.

27. The method of claim 8, further comprising:
generating a second reference current; and
discharging the charge appearing on the reference node from a second predetermined voltage level to a third predetermined voltage level, the third predetermined voltage level being a voltage between the predetermined voltage level and the second predetermined voltage level.

28. The method of claim 8, further comprising mirroring the reference current to produce a substantial duplicate thereof, the current proportional to the reference current being the substantial duplicate thereof.

29. The nonvolatile memory device of claim 10, wherein the startup circuit further comprises:
a second discharge circuit coupled to the voltage reference circuit for receiving a second reference current and for discharging the charge appearing on the at least one reference node substantially from the initial voltage level towards the predetermined voltage level, a rate of discharge being based upon the second reference current.

30. The nonvolatile memory device of claim 10, wherein the current proportional to the reference current is substantially the same as the reference current.

31. The nonvolatile memory device of claim 17, wherein the current buffer circuitry provides to each first reference node a substantial duplicate of the reference current level.

32. The nonvolatile memory device of claim 21, wherein each startup circuit further comprises a second discharge circuit for receiving a second reference current and for discharging the charge appearing on the first reference node corresponding thereto substantially from the initial voltage level towards the predetermined voltage level, a rate of discharge being based upon the received second reference current.

33. The nonvolatile memory device of claim 32, wherein each second discharge circuit discharges the charge appearing on the corresponding first reference node until the corresponding first reference node reaches a second predetermined voltage level greater than the first predetermined voltage level.

34. A circuit for providing a reference current in a memory device having at least one sense amplifier, comprising:
a reference generator circuit for generating a reference current;
a second reference generator circuit for generating a second reference current; and
at least one startup circuit for initially setting a reference node to a predetermined voltage level, the reference node being coupled to the at least one sense amplifier, comprising:
a circuit coupled to the reference generator circuit for changing a charge appearing on the reference node from an initial voltage level towards the predetermined voltage level, a rate of change being based upon the reference current; and
a second circuit coupled to the second reference generator circuit for changing a charge appearing on the reference node from an initial voltage level towards the predetermined voltage level, a rate of change being based upon the second reference current.

35. The circuit of claim 34, wherein the circuit discharges the charge appearing on the reference node from the initial voltage level to the predetermined voltage level, a rate of change being based upon the reference current.

36. The circuit of claim 34, wherein the circuit comprises:
a first transistor having a control terminal coupled to an output of the reference generator circuit, a first conduction terminal coupled to a supply voltage reference and a second conduction terminal;
a current mirror having a first leg coupled to the second conduction terminal of the first transistor and a second leg coupled to the reference node;
a second transistor having a first conduction terminal coupled to the second conduction terminal of the first transistor, a second conduction terminal coupled to a second supply voltage reference and a control terminal; and
a drive circuit for driving the control terminal of the second transistor so that an amount of current from the first transistor passing through the second transistor is gradually increased.

37. The circuit of claim 36, wherein the drive circuit comprises:
a third transistor having a control terminal coupled to the reference node, a first conduction terminal coupled to the supply voltage reference and a second conduction terminal, the second conduction terminal being connected to the control terminal of the second transistor; and
a fourth transistor having a first conduction terminal coupled to the second conduction terminal of the third transistor and the control terminal of the second transistor, a second conduction terminal coupled to the second supply voltage reference and a control terminal coupled to the first conduction terminal of the fourth transistor.

38. The circuit of claim 36, wherein the current mirror comprises:
a third transistor coupled between the second conduction terminal of the first transistor and the second supply voltage reference; and
a fourth transistor coupled between the reference node and the second supply voltage reference, a control terminal of the fourth transistor being connected to the control terminal of the third transistor.

39. The circuit of claim 36, wherein:
the drive circuit has an input connected to the reference node and provides an output signal having a voltage that varies inversely with the voltage appearing on the reference node.

40. The circuit of claim 34, further comprising:
a current buffer circuit coupled between the reference generator circuit and the reference node for providing to a plurality of reference nodes a current proportional to the reference current.

41. A nonvolatile memory device, comprising:
an array of memory cells arranged into rows and columns of memory cells and including a plurality of column lines, each column of memory cells being coupled to a distinct column line;
address decode circuitry having input signals coupled to address input pins of the memory device and adapted to select a row and a plurality of columns of memory cells;
a plurality of sense amplifier circuits, each sense amplifier circuit being coupled to a plurality of column lines, column lines selected by the address decode circuitry being connected to the sense amplifier circuits, the sense amplifiers serving to detect a difference between the selected columns lines and a reference; and
circuitry for providing a reference current to the sense amplifier circuits, comprising:
a reference generator circuit for generating a reference current;

a current buffer circuit for generating at least one current proportional to the reference current and applying the at least one proportional current to at least one reference node to which at least some of the sense amplifiers are coupled;

at least one startup circuit for initially setting the at least one reference node to a predetermined voltage level, comprising:

a circuit coupled to the reference generator circuit for changing a charge appearing on the at least one reference node from an initial voltage level to the predetermined voltage level, a rate of change being based upon the reference current; and a second circuit for changing the charge appearing on the reference node approximately from the initial voltage level towards the predetermined voltage level, a rate of change being based upon a second reference current.

42. The nonvolatile memory device of claim 41, wherein the reference generator circuit comprises a transistor having a structure similar to the structure of the memory cells in the array, the reference current comprising the current in the transistor.

* * * * *

UNITED STATES PATENT AND TRADEMARK OFFICE
CERTIFICATE OF CORRECTION

PATENT NO.    : 6,707,715 B2
DATED         : March 16, 2004
INVENTOR(S)   : Oron Michael et al.

It is certified that error appears in the above-identified patent and that said Letters Patent is hereby corrected as shown below:

Title page,
Item [56], References Cited, U.S. PATENT DOCUMENTS, replace
"4,918,339         -- 4,918,339     *
  5,729,493" with    5,729,493     * -- replace
"6,363,029         -- 6,363,029     *
  6,438,032          6,438,032     *
  6,490,200" with    6,490,200     * --.

Column 10,
Line 30, replace "device, comprising:" with -- device having at least one sense amplifier, comprising: --.
Line 37, replace "setting the reference" with -- setting a reference --.

Column 11,
Line 37, replace "A method setting" with -- A method for setting --.
Lines 49-51, delete "second discharging the charge appearing on the reference node to a third predetermined level at a rate that is based upon the reference current."

Column 13,
Line 19, replace "address decode" with -- an address decode --.

Column 14,
Line 15, replace "a nonvolatile memory device, comprising:" with -- a nonvolatile memory device coupled to the processing element, comprising: --.
Line 21, replace "to select a row and a plurality" with -- to select a row and one or more of said plurality --.

Signed and Sealed this

Sixth Day of December, 2005

JON W. DUDAS
*Director of the United States Patent and Trademark Office*